United States Patent [19]

Phillips et al.

[11] Patent Number: 5,623,450
[45] Date of Patent: Apr. 22, 1997

[54] CONDITIONAL RECHARGE FOR DYNAMIC LOGIC

[75] Inventors: Larry B. Phillips; Robert P. Masleid; John S. Muhich, all of Austin, Tex.

[73] Assignee: International Business Machines Corporation, Armonk, N.Y.

[21] Appl. No.: 525,444

[22] Filed: Sep. 8, 1995

[51] Int. Cl.$^6$ .................................................. G11C 7/06
[52] U.S. Cl. .................... 365/203; 365/189.05; 365/227; 365/230.08
[58] Field of Search ................................. 365/203, 227, 365/189.05, 230.08

[56] References Cited

U.S. PATENT DOCUMENTS

| | | | |
|---|---|---|---|
| 4,777,625 | 10/1988 | Sakui et al. | 365/189 |
| 4,963,769 | 10/1990 | Hitpold et al. | 307/465 |
| 5,043,947 | 8/1991 | Oshima et al. | 365/230.03 |
| 5,121,003 | 6/1992 | Williams | 307/452 |
| 5,128,897 | 7/1992 | McClure | 365/230.06 |
| 5,214,951 | 6/1993 | Slemmer et al. | 365/230.06 |
| 5,251,178 | 10/1993 | Childers | 365/227 |
| 5,267,215 | 11/1993 | Tsujimoto | 365/230.03 |
| 5,280,452 | 1/1994 | Dhong et al. | 365/205 |
| 5,297,090 | 3/1994 | McClure | 365/203 |
| 5,297,092 | 3/1994 | Johnson | 365/203 |
| 5,331,601 | 7/1994 | Parris | 365/230.08 |
| 5,349,560 | 9/1994 | Suh et al. | 365/203 |
| 5,355,347 | 10/1994 | Cioaca | 365/230.08 |
| 5,453,708 | 9/1995 | Gupta et al. | 326/98 |
| 5,471,158 | 11/1995 | Mehta | 365/203 |
| 5,517,136 | 5/1996 | Harris et al. | 326/93 |

FOREIGN PATENT DOCUMENTS

| 5109283 | 4/1993 | Japan | G11C 11/41 |
|---|---|---|---|

Primary Examiner—David C. Nelms
Assistant Examiner—H. Nguyen
Attorney, Agent, or Firm—Benman Collins & Sawyer; Michael A. Davis, Jr.

[57] ABSTRACT

A system and method is disclosed for saving power dissipated during the recharge of large arrays, such a domino SRAMS, by activating only the recharge circuits for the parts of the array that was accessed during the previous cycle. This is accomplished by intercepting the recharge signals and deactivating the signals for the non-accessed portions of the array.

7 Claims, 2 Drawing Sheets

CONDITIONAL RECHARGE FOR DYNAMIC LOGIC

CROSS-REFERENCE TO RELATED APPLICATIONS

The present application is related to application Ser. No. 08/525,939, entitled "High Speed SRAM With OR-Gate Sense" filed on the same date as the present application and assigned to the assignee of the present application.

FIELD OF THE INVENTION

The present invention relates to random access memories in microprocessor applications, and more particularly to a system and method for conditionally recharging dynamic logic circuits in array-based structures, such as a static random access memory, to decrease power consumption.

BACKGROUND OF THE INVENTION

Power conservation is a major design objective, even in high performance circuits. High speed embedded static random access memories (SRAMs) in current superscalar processors are struggling to keep up with the processors due to rapidly decreasing processor cycle times and to restrictions on power consumption. As processor designs increase in both the degree of scalarity (number of execution units) and word size, embedded cache SRAMs are both limiting processor speed (or decreasing throughput as latency increases) and contributing significantly to such a chip's power consumption.

The limitations associated with SRAMs are primarily due to conventional SRAM design. A SRAM typically comprises an array of cells. The cells in each column of the array are coupled by two lines, known as bit lines, to a sense amplifier, which reads the information stored in the cells by sensing a small differential voltage across the bit-line pair.

Traditional SRAM designs create several power consumption issues. First, wide line sizes comprising the SRAM circuits greatly increase power consumption by requiring many more sense amplifiers, and also take away a design freedom. Second, sense amplifiers dissipate a significant amount of power because the transistors used in differential amplifiers must be placed into a linear operating mode until the voltage difference across the bit-line pair exceeds a predetermined threshold. In addition, due to architectural restrictions, sense amplifiers are becoming more difficult to design; and the traditional method of increasing speed in a SRAM is to increase the power supplied to the sense amplifier.

Accordingly, what is needed is a system and method for providing a RAM structure that uses a sense approach that both increases performance and decreases power consumption. The present invention addresses such a need.

SUMMARY OF THE INVENTION

The present invention is a system and method for conditionally recharging dynamic logic circuits in a random access memory array, wherein a portion of the dynamic logic circuits are accessed during a previous cycle for evaluation, and the random access memory array is recharged by the activation of recharge signals. The system and method comprises means for determining particular ones of the dynamic logic circuits that were accessed during the previous cycle, and means for deactivating the recharge signals associated with the non-accessed dynamic logic circuits, whereby only the accessed dynamic logic circuits are recharged.

According to the system and method disclosed herein, the recharge power savings provided by the conditional recharge circuit is approximately proportional to the number of local cell groups or words in the RAM array.

DESCRIPTION OF THE INVENTION

The present invention relates to an improvement in random access memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Other types of circuits exist besides those traditionally used to make memory circuits. For example, one type of circuits used to make logic circuits, such as those comprising processor logic, are referred to as dynamic circuits. To clarify that dynamic circuits are different from dynamic type memories, dynamic circuits are referred to here as domino circuits. Domino circuits typically include dynamic nodes that are coupled to a logic tree. During a precharge cycle, the dynamic node is precharged with a voltage, and during an evaluation cycle, the logic tree discharges the dynamic node for evaluation. While domino circuits have long been used to increase performance of logic circuits, they have not traditionally been applied to memory circuits.

Figure 1:
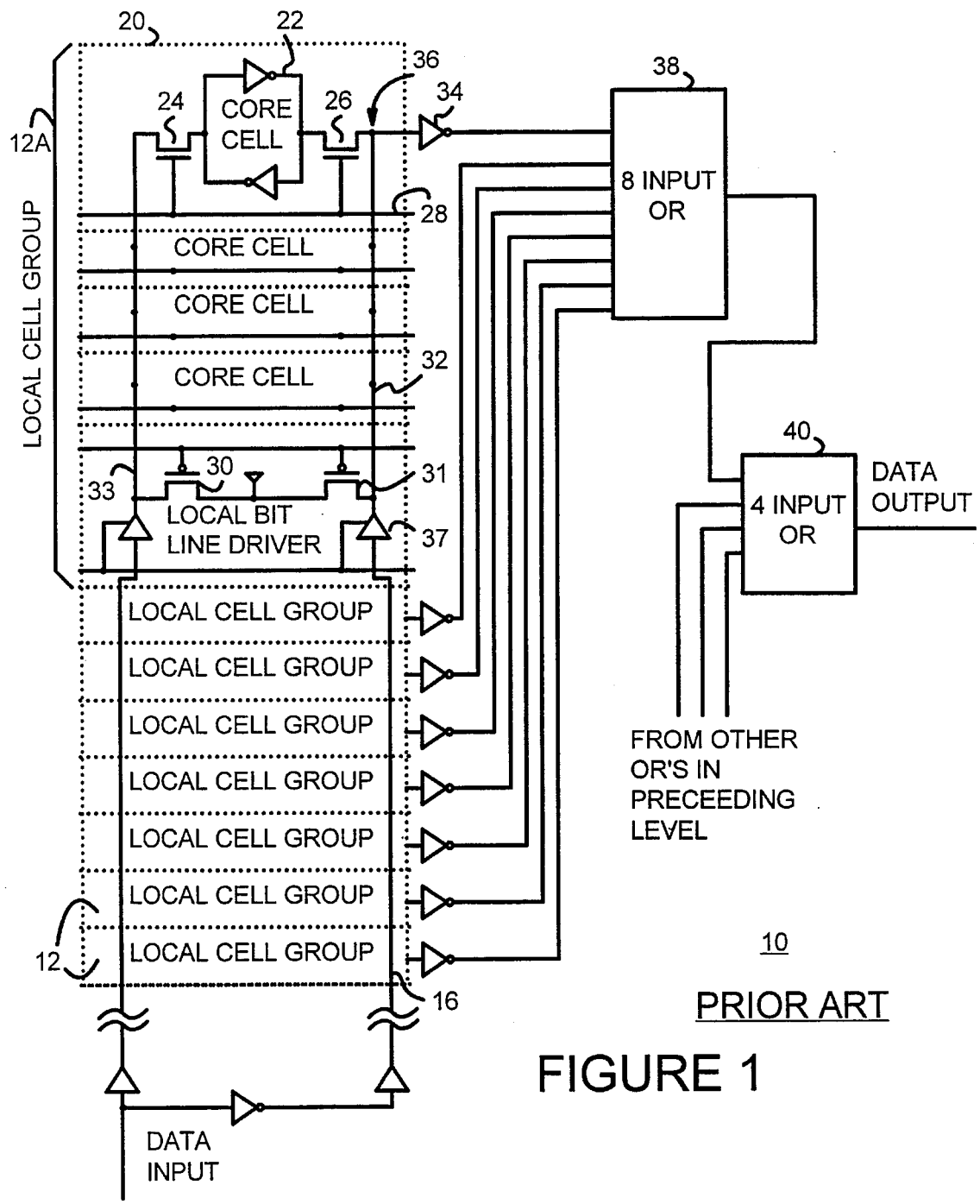
FIG. 1 is a block diagram of a one column array in a prior art SRAM.

Copending application Ser. No. 08/525,939, entitled "High Speed SRAM With OR-Gate Sense" which is herein incorporated by reference, discloses a system and method for combining an SRAM with a domino circuit to provide a domino SRAM that has an OR-gate sense function. Referring to FIG. 1, a high speed domino SRAM 10 is shown, which is divided into local cell groups 12. In a preferred embodiment of the invention, each of the local cell groups 12, shown in expanded cell group 12A, includes four core cells 20. The SRAM 10 replaces conventional sense amplifiers used in SRAMs by partitioning conventional global bit lines into a local bit line 32 and a local bit line 33 for each of the local cell groups 12. A precharge device 30 is coupled to each one of the local bit lines 33, and a precharge device 31 and a ratioed inverter 34 are coupled to each one of the local bit lines 32. The combination of the local bit line 32, the precharge device 31, and the ratioed inverter 34 transforms a conventional global bit line into a dynamic node 36 of a domino circuit, and provides the sense function for the cell group 12A. Each of the inverters 34 corresponding to a local cell group 12 are input to an Or-gate tree hierarchy comprising an eight-way input-Or 38 and a four-way input-Or 40 in order to produce output data.

As disclosed in co-pending application Ser. No. 08/525,939, dynamic logic circuits, such as the domino circuit used in SRAM 10 of the present invention, offer improved performance in many instances over static type structures.

However, following an evaluation cycle in which the core cells 20 are read, a recharge cycle is necessary to recharge or precharge the dynamic logic, which increases the SRAM's power consumption.

The present invention takes advantage of the fact that array type structures, such as the SRAM 10, are commonly very large, but only a fraction of the array is normally accessed. Conventional dynamic recharge circuits transmit recharge signals to the entire array structure every recharge cycle. The power consumed by switching all of the recharge circuits, and their associated metal lines, is largely wasted since most of the array has not been accessed.

The present invention saves a significant amount of power that is dissipated in large arrays by driving only the recharge circuits for the parts of the array that were accessed during the previous cycle. This is accomplished by intercepting the recharge signals and deactivating the signals for the non-accessed portions of the array.

Figure 2:
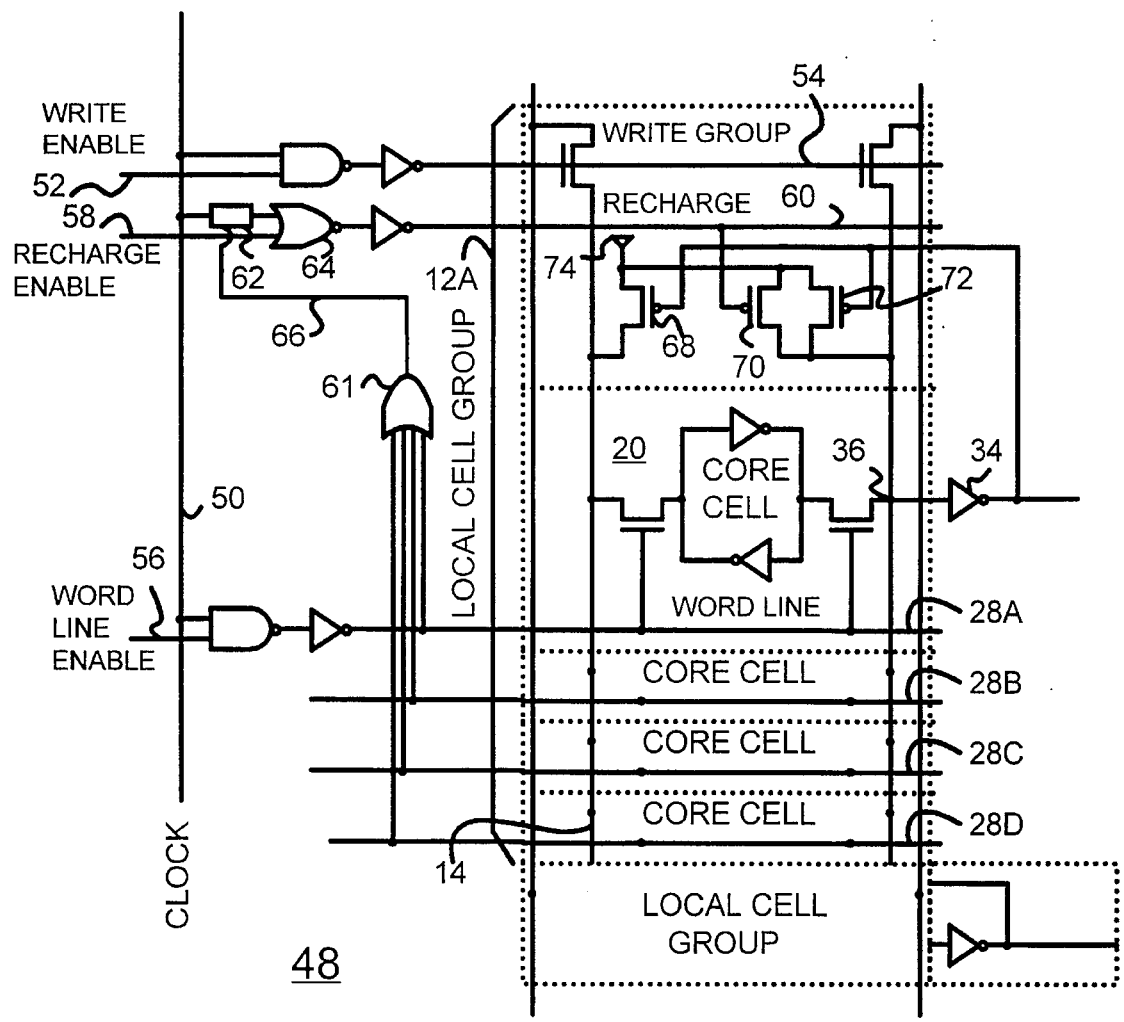
FIG. 2 is a block diagram of the conditional recharge circuit of the present invention.

Referring now to FIG. 2, a block diagram of a conditional recharge circuit 48 of the present invention is shown. As also shown in FIG. 1, the local cell group 12A includes four core cells, where core cell 20 is shown in detail. Each local cell group 12 includes a corresponding write enable signal 52 for driving a write group line 54, and a recharge enable signal 58 for driving a recharge line 60. The function of the recharge line 60 is to reset the dynamic node 36 after the dynamic node 36 has discharged. Each core cell 20 within the local cell group 12A includes a word line enable 56 for driving a corresponding word line 28A, 28B, 28C, and 28D. The write enable signal 52, the recharge enable signal 58, and the word line enable 56 are all coupled to a clock signal 50.

One feature of the present invention is remembering during the next recharge cycle, which area of the SRAM 10 has been accessed. This is accomplished by coupling a latch 62 and a recharge enable gate 64 to the recharge enable line 58, and by coupling the word lines 28A, 28B, 28C, and 28D to an Or-gate 61, which is connected to the latch 62.

To access a word local cell group 12A, one of the word lines 28A–28D is activated by a corresponding word line enable 56. The word lines 28A–28D are coupled into the Or-gate 61 such that the activation of one of the word lines 28A–28D sets the latch 62 via line 66.

During a recharge cycle, all the recharge lines 60 are typically activated to recharge the entire array. According to the present invention, however, the recharge enable gate 64 intercepts the recharge enable line 58 and activates the recharge line 60 only if the corresponding latch 62 was set during the previous cycle. In other words, the recharge enable gate 64 disables the recharge line 60 where the associated logic has not been accessed. Although the latch 62 and the recharge enable gate 64 are shown in conjunction with a local cell group occupying level one of the array, the latch 62 and the recharge enable gate 64 may also be used in higher levels of the array.

The dynamic node 36 is recharged or precharged via a pre-charge device responsive to the recharge line 60, shown here as a p-transistor 70. Since a dynamic node 36 is a precharge circuit, it is possible for the precharge capacitance to discharge due to leakage. Conventional methods to keep the dynamic node 36 charged feed the output of the dynamic node 36 through a p-transistor. The present invention uses two half latch devices (p-transistors) 68 and 72 to hold the dynamic node 36 in the recharge state until they are evaluated. This is accomplished by inputing the output of the ratioed inverter 34 to the first half latch device 68 together with the Vdd signal 74. The first half latch device 68 is coupled to the second half latch device 72, and the second half latch device 72 is coupled to the dynamic node 36. A small amount of leakage from the local cell group 12A causes the second half latch device 72 to develop a drain-to-source voltage and to conduct a small amount of current to restore the dynamic node 36 to Vdd.

According to the present invention, the dynamic node 36 is held in the precharge state by the half latch devices 68 and 72 if words were not previously read from the local cell group 12A. On system reset, the latch 62 is enabled and the dynamic node 36 is precharged by p-transistor 70.

The half latch devices 68 and 72 may also be used to enable low speed or static usage that is advantageous for test and debug, so the overhead required for this circuit can be shared with other requirements. As current submicron technologies are becoming dominated by interconnect capacitance, the recharge power savings provided by the conditional recharge circuit 48 of the present invention is approximately proportional to the number of local cell groups or words in the array, depending on the array logic organization.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A circuit for conditionally recharging dynamic logic circuits in a random access memory array, wherein a portion of the dynamic logic circuits are accessed during a previous cycle for evaluation, and the random access memory array is recharged by the activation of recharge signals, the circuit comprising:

means for determining the portion of the dynamic logic circuits that were accessed using a respective word line signal during the previous cycle, the means for determining including a latch coupled to each one of the recharge signals and to the corresponding word lines, wherein the latch is set when one of the corresponding word lines is activated; and means for deactivating the recharge signals associated with the dynamic logic circuits that are not accessed, such that only the accessed dynamic logic circuits are recharged.

2. A circuit as in claim 1 wherein the means for deactivating the recharge signals includes a recharge enable gate coupled between the latch and the dynamic logic circuit for deactivating the recharge signal coupled to the latch when the latch has not been set.

3. A circuit for conditionally recharging a dynamic node, the dynamic node including a plurality of memory cells coupled by a local bit line, and the bit line is coupled to an inverter, the circuit comprising:

a clock signal;

a word line signal for each of the cells extending between the clock signal and the local bit line;

a recharge signal coupled to the clock signal;

a latch coupled to the recharge signal and to each of the word lines, wherein the latch is set when one of the word lines is activated; and a gate coupled between the latch and the recharge signal for deactivating the recharge signal when the latch is not set.

4. A circuit as is claim 3 further including:

a first half latch;

a Vdd signal;

a second half latch; and a transistor responsive to the recharge signal for charging the dynamic node during a recharge cycle, wherein the output of the inverter is coupled to the first half latch, and the first half latch is coupled between the Vdd signal and the second half latch for holding the charge of the dynamic node until the dynamic node is evaluated.

5. A method for conditionally recharging dynamic logic circuits in a random access memory array, wherein a portion of the dynamic logic circuits are accessed during a previous cycle for evaluation, and the array is recharged by the activation of recharge signals, the method comprising the steps of:

determining particular ones of the dynamic logic circuits that were accessed during the previous cycle by i) coupling a latch to a recharge line, and ii) setting the latch if the corresponding dynamic logic circuit was accessed during the previous cycle;

intercepting the recharge signals associated with the non-accessed dynamic logic circuits; and deactivating the recharge signals associated with the non-accessed dynamic logic circuits, such that only the accessed dynamic logic circuits are recharged.

6. A method as in claim 5 wherein the dynamic logic circuits are dynamic Or-gates.

7. A method as in claim 6 wherein the array is a SRAM.

* * * * *